United States Patent [19]
Morizuka et al.

[11] Patent Number: 6,127,716
[45] Date of Patent: Oct. 3, 2000

[54] HETEROJUNCTION BIPOLAR TRANSISTOR AND MANUFACTURING METHOD THEREOF

[75] Inventors: Kouhei Morizuka; Masayuki Sugiura, both of Kanagawa-ken, Japan

[73] Assignee: Kabushiki Kaisha Toshiba, Kawasaki, Japan

[21] Appl. No.: 09/414,839

[22] Filed: Oct. 8, 1999

[30] Foreign Application Priority Data

Oct. 9, 1998 [JP] Japan ................................ 10-287698

[51] Int. Cl.⁷ .................... H01L 27/082; H01L 27/102
[52] U.S. Cl. .................... 257/503; 257/523; 257/526; 257/586; 257/587; 257/593; 257/198; 438/312; 438/318; 438/353
[58] Field of Search .................... 257/197, 198, 257/503, 523, 526, 552, 586, 587, 593; 438/312, 318, 353, 423

[56] References Cited

U.S. PATENT DOCUMENTS

| | | | |
|---|---|---|---|
| 4,939,562 | 7/1990 | Adlerstein | 257/198 |
| 5,084,750 | 1/1992 | Adlerstein | 257/574 |
| 5,373,185 | 12/1994 | Sato | 257/197 |
| 5,734,193 | 3/1998 | Bayraktaroglu et al. | 257/579 |
| 5,739,578 | 4/1998 | Goto | 257/578 |
| 5,793,067 | 8/1998 | Miura et al. | 257/183 |
| 5,864,169 | 1/1999 | Shimura et al. | 257/587 |
| 5,965,930 | 10/1999 | Sakamoto et al. | 257/584 |
| 5,986,324 | 11/1999 | Adlerstein et al. | 257/587 |

OTHER PUBLICATIONS

H. Sato, et al., "Bump Heat Sink Technology—A Novel Assembly Technology Suitable For Power HBTs," IEEE GaAs IC Symposium, (1993), pp. 337–340.

Gordon MA, et al., "High Efficiency LDMOS Power FET for Low Voltage Wireless Communications," IEDM, (1996), pp. 91–94.

*Primary Examiner*—John Guay
*Attorney, Agent, or Firm*—Oblon, Spivak, McClelland, Maier & Neustadt, P.C.

[57] ABSTRACT

On an n-type semiconductor substrate 41 doped in high density, a p-type semiconductor layer 2, an n-type semiconductor layer 4 doped in high density, which is a collector, a p-type semiconductor layer 6 doped in high density, which is a base, and the n-type semiconductor layer 7, which is an emitter, are sequentially stacked. To the collector layer, a collector electrode 12 is electrically connected, and to the base layer, a base electrode 11 is electrically connected, and to the emitter layer, an emitter electrode 9 is electrically connected, and thus a bipolar transistor is structured. On the bipolar transistor, an insulated isolation area 55 is formed with an opening therein, whose depth reaches the surface of the substrate, and a substrate electrode 48 is formed thereon. On the bipolar transistor and the insulated isolation area 55, an inter-layer dielectric layer 54 is formed having contact holes formed to upper parts of the emitter electrode 49 and to the substrate electrode 48. The emitter electrode 49 and the substrate electrode 48 are connected to each other by ground wiring.

22 Claims, 11 Drawing Sheets

HETEROJUNCTION BIPOLAR TRANSISTOR AND MANUFACTURING METHOD THEREOF

BACKGROUND OF THE INVENTION

The present invention relates to a bipolar transistor for a high frequency power amplifier that has a high gain with a small chip size and more particularly to a grounded emitter heterojunction bipolar transistor using a compound semiconductor.

With wide spread of portable radio terminals, performance of a high frequency power amplifier has been improved rapidly as well as decrease in cost. To increase the portability, it is necessary to reduce the number of batteries and supply voltage that has been strongly required recently. For that purpose, an HBT (heterojunction bipolar transistor) has been widely used which incorporate a GaAs series epitaxial wafer capable of highly efficient amplification even if the supply voltage becomes low. Such an epitaxial wafer is extremely expensive compared with the conventional Si substrate and GaAs substrate, so that it is an important problem to realize a power amplifier having a small chip area.

To portable terminals newly appeared recently, higher frequency bands have been allocated gradually. For example, in an analog portable telephone, a frequency of about 1 GHz is conventionally allocated, while in a recent digital portable telephone, the frequency is increased to about 2 GHz and furthermore, use of up to 5 GHz can be considered. When the frequency increases in this way, some improvements are device is necessary also for a method for mounting the power amplification transistor. Particularly, the inductance generated by a bonding wire connected to a ground electrode has serious problems.

Namely, since a high power transistor has a large element size, the input impedance decreases. Therefore, unless the ground inductance is reduced according to the element size, the portion of input signals applied to the transistor reduces and the power gain greatly decreases. Since the input impedance of the transistor is generally capacitive, the problem of the ground inductance is serious when the frequency is high. When the emitter is connected to the ground by wire bonding, it is necessary to increase the number of wires to make the ground inductance lower according to the element size. Therefore, although it is necessary to increase the number of bonding pads for grounding according to the element size, the chip area increases extremely since the bonding pad area is large, and thus the cost is increased inevitably.

FIG. 1 is a plane layout of a pattern showing an example of a conventional HBT. In this figure, a number of 32 transistor elements are formed at the central part of a semiconductor chip (1). However only emitter electrodes (2) of these elements are shown in FIG. 1. In the upper and lower peripherals of the semiconductor chip (1), a number of 12 bonding pads (3) are arranged. Although omitted in the drawing, the emitter electrodes (2) of 32 transistor elements are grouped properly and connected to each of the 12 bonding pads (3) by wire patterns formed in the semiconductor chip (1). Each bonding pad (3) is connected and grounded to a ground conductor provided outside the semiconductor chip (1) by a wire.

In such a conventional HBT, although 12 bonding wires are used to lower the emitter inductance, the ground inductance lowers only to 0.1 nH and the power gain is degraded greatly such as 9 dB. To install many bonding pads 3, it is necessary to make the chip area larger so that the area required to obtain an output of 30 dBm is 1.2×1.0 mm$^2$.

Furthermore, even if a plurality of bonding wires are used, the inductance lowers only slowly rather than inversely proportional to the number of wires due to the mutual inductance between the wires and, thus, there is a limitation to the method for mounting the chip by conventional wire bonding.

Therefore, the method for boring a viahole in a GaAs substrate has been used as a method in place of bonding. The method, in a transistor formed on a semi-insulating GaAs substrate, bores a hole in the GaAs substrate under an emitter electrode pad by etching and connects the ground conductor provided on the back of the GaAs substrate and the emitter electrode by a plated wire. When the plated wire is used for connection, the inductance is small such as 1/10 or less of that by wire bonding. The ground inductance thus can be lowered sufficiently without increasing the number of emitter electrode pads with the high gain being maintained. Generally, however, to bore a viahole in a substrate, such a complicated process is required that the substrate is thinned to about 50 μm and the processing is performed from the back of the substrate that is still an unskilled mass production art. Therefore, it cannot sufficiently comply with the demand for reduction in cost.

Another method for using a flip chip is available. With this method, a projection such as a gold bump is provided on an emitter electrode pad installed on the surface of a substrate. Then the substrate is turned upside down and connected to the ground surface. Therefore, the inductance of the emitter is extremely small and a high gain can be ensured. However, it is necessary to connect the electrodes other than the emitter with a bump, so that an advanced art and a special device are required for chip alignment. The method, thus, cannot sufficiently comply with the demand for reduction in cost.

As another conventional art available to the resolution of above problems, an art achieving satisfactory results in an Si-MOS field effect transistor will be described by referring to FIG. 2. In high-frequency power MOSFET for a portable terminal, n-channel MOSFET is produced using a p-type epitaxial layer (28) of low density on a p-type substrate (21) of high density. In this case, a p-type area (22) of high density is formed by diffusion until it reaches the p-type substrate from the surface. When the p-type area (22) is connected to a source electrode (23), the source electrode is connected to a ground electrode (29) on the back of the substrate with low impedance via the p-type substrate (21) of high density. With this method, no special process is required and hence a power transistor suited to the high-frequency operation can be formed at low cost.

However, in the diffusion process of forming the area (22) for connecting the source area to the p-type substrate, a problem arises that upper diffusion of boron which is acceptor impurities included in the substrate (21) progresses at the same time and control of the thickness of the low density layer (28) is difficult. In this structure, the ground capacity connected to the base wires and collector wires is large since the substrate is conductive. When the ground capacity is designed to be included in the impedance matching circuit, the performance such as power gain will not be degraded. However, as mentioned above, it is difficult to control the thickness of the low-density area (28). Consequently, a problem arises that the ground capacity connected to the base wires and collector wires varies greatly and the design precision may be lost.

Further, for GHz band power amplification, an npn bipolar transistor having an buried collector structure has been used. FIG. 3 schematically shows a cross sectional structure of a bipolar transistor having an buried collector layer generally used. Such a transistor is produced by diffusing n-type impurities of high density selectively on a p-type Si substrate (30) of low density, forming an buried collector area (31), growing an epitaxial layer (32) of low density, and then forming a p-type base area (37) and an n-type emitter area (38) by selective diffusion. In this case, the diffusion process for the buried collector layer and the epitaxial growth process of the low-density layer (32) require a high-temperature process. Although it is tried produce a high-frequency bipolar transistor having an buried collector layer stacked on a conductive substrate an epitaxial layer of low density further stacked on the buried collector layer, it is impossible to maintain a desired carrier profile due to existence of this high-temperature process.

Due to the obstacle relating to the manufacturing method, the method for lowering the ground inductance using a conductive substrate in a bipolar transistor cannot be used for a bipolar transistor used for high-frequency power amplification.

SUMMARY OF THE INVENTION

An object of the present invention is to provide a high-frequency power semiconductor device with a small chip size having small ground inductance and to provide a manufacturing method thereof.

Another object of the present invention is to provide a structure of a grounded emitter type HBT device using GaAs that has a small size and small ground inductance and also to provide a manufacturing method thereof.

Still another object of the present invention is to provide a structure of a grounded emitter type HBT device which has a small size and small ground inductance, wherein the heat radiation effect of the device is improved and a manufacturing method thereof.

A semiconductor device according to the present invention comprises a conductive compound semiconductor substrate that impurities are doped in high density, an isolation layer stacked on the substrate, a bipolar transistor element that a collector layer, base layer, and emitter layer are sequentially stacked and formed on the isolation layer and that a collector electrode, base electrode, and emitter electrode are provided on the respective layers, an insulated isolation layer formed on the compound semiconductor substrate outside the area where the bipolar transistor element is formed, and a ground wiring layer for electrically connecting the emitter electrode of the bipolar transistor element and the compound semiconductor substrate via a contact hole formed in the insulator layer.

The semiconductor device according to the present invention is characterized in that the bipolar transistor element comprises a compound semiconductor having heterojunction and the band-gap energy of the emitter layer is wider than the band-gap energy of the base layer.

Furthermore, the semiconductor device according to the present invention is characterized in that the compound semiconductor substrate includes p-type or n-type impurities.

Furthermore, the semiconductor device according to the present invention is characterized in that the isolating layers comprise reverse bias P-N junction when the compound semiconductor substrate is of an n type.

Furthermore, the semiconductor device according to the present invention is characterized in that the isolating layers comprise reverse bias P-N junction where p-type portion forms a tunnel junction with the compound semiconductor substrate when the substrate is of an n type.

Furthermore, the semiconductor device according to the present invention is characterized in that the isolating layers comprise a non-dope semiconductor layer when the compound semiconductor substrate is of a p type.

Furthermore, the semiconductor device according to the present invention is characterized in that the emitter layer is a n-type semiconductor layer, the base layer is a p-type semiconductor layer doped in high density, and the collector layer is a n-type semiconductor layer doped in high density.

Furthermore, in the semiconductor device according to the present invention, insulated isolation area is an area that the resistance is increased by ion implantation into the collector layer.

Furthermore, in the semiconductor device according to the present invention, the bipolar transistor element has a heterojunction and is formed in a mesa shape.

Furthermore, in the semiconductor device of the present invention, a plurality of transistor elements is arranged on the semiconductor substrate and the contact hole for grounding is formed in the area between transistor elements.

A semiconductor device according to the present invention comprises an n-type semiconductor substrate doped in high density, a p-type semiconductor layer stacked on the semiconductor substrate, a n-type collector layer doped in high density which is stacked on the p-type semiconductor layer, a p-type base layer doped in high density which is stacked on the collector layer, a n-type emitter layer stacked on the base layer, a collector electrode formed on the collector layer, a base electrode formed on the base layer, an emitter electrode formed on the emitter layer, an insulated isolation area formed on the collector layer outside an area where a bipolar transistor element is formed including the collector layer, base layer, and emitter layer, a substrate electrode formed on the semiconductor substrate in an opening formed in the insulated isolation area, an inter-layer dielectric layer stacked on the insulated isolation area and on the bipolar transistor element, a ground wiring layer formed on the inter-layer dielectric layer so as to connect the emitter electrode and the substrate electrode via a contact hole formed in the inter-layer dielectric layer, and a ground electrode formed on the back of the semiconductor substrate.

Furthermore, the semiconductor device according to the present invention comprises an n-type semiconductor substrate doped in high density, a p-type semiconductor layer doped in high density which is stacked on the semiconductor substrate, an n-type collector layer doped in high density which is stacked on the p-type semiconductor layer, a p-type base layer doped in high density which is stacked on the collector layer, an n-type emitter layer stacked on the base layer, a collector electrode formed on the collector layer, abase electrode formed on the base layer, an emitter electrode formed on the emitter layer, an insulated isolation area formed on the collector layer outside an area where a bipolar transistor element is formed including the collector layer, base layer, and emitter layer, a substrate electrode formed on the semiconductor substrate in an opening formed in the insulated isolation area, an inter-layer dielectric layer stacked on the insulated isolation area where the substrate electrode is formed and on the bipolar transistor element, a ground wiring layer formed on the inter-layer dielectric layer so as to connect the emitter electrode and the substrate electrode via a contact hole formed in the inter-layer dielectric layer, and a ground electrode formed on the back of the semiconductor substrate, wherein the aforementioned n-type semiconductor substrate doped in high density and the p-type semiconductor substrate doped in high density which is stacked on the substrate form tunnel junction.

Furthermore, a semiconductor device according to the present invention comprises a n-type semiconductor substrate doped in high density, a semiconductor layer stacked on the semiconductor substrate, a n-type collector layer doped in high density which is stacked on the semiconductor layer, a p-type base layer doped in high density which is stacked on the collector layer, a n-type emitter layer stacked on the base layer, a collector electrode formed on the collector layer, a base electrode formed on the base layer, an emitter electrode formed on the emitter layer, an insulated isolation area formed on the collector layer outside an area where a bipolar transistor element is formed including the collector layer, base layer, and emitter layer, a substrate electrode formed on the semiconductor substrate in an opening formed in the insulated isolation area, an inter-layer dielectric layer stacked on the insulated isolation area and on the bipolar transistor element, a ground wiring layer formed on the inter-layer dielectric layer so as to connect the emitter electrode and the substrate electrode via a contact hole formed in the inter-layer dielectric layer, and a ground electrode formed on the back of the semiconductor substrate, wherein at least a part of the semiconductor layer includes a semiconductor layer such that the band-gap energy therof is larger than the band-gap energy of the n-type semiconductor substrate doped in high density.

Furthermore, the semiconductor device according to the present invention is characterized in that the semiconductor layer is a non-doped semiconductor layer.

Furthermore, a semiconductor device according to the present invention comprises a p-type semiconductor substrate doped in high density, a non-doping semiconductor layer stacked on the semiconductor substrate, a n-type collector layer doped in high density which is stacked on the non-doping semiconductor layer, a p-type base layer doped in high density which is stacked on the collector layer, a n-type emitter layer stacked on the base layer, a collector electrode formed on the collector layer, a base electrode formed on the base layer, an emitter electrode formed on the emitter layer, an insulated isolation area formed on the collector layer outside an area where a bipolar transistor element is formed including the collector layer, base layer, and emitter layer, a substrate electrode formed on the semiconductor substrate in an opening formed in the insulated isolation area, an inter-layer dielectric layer stacked on the insulated isolation area and on the bipolar transistor element, a ground wiring layer formed on the inter-layer dielectric layer so as to connect the emitter electrode and the substrate electrode via a contact hole formed in the inter-layer dielectric layer, and a ground electrode formed on the back of the semiconductor substrate.

Furthermore, a semiconductor device according to the present invention comprises a n-type or p-type compound semiconductor substrate doped in high density, an isolation layer stacked on the substrate, a compound semiconductor transistor element that a collector layer, base layer, and emitter layer are sequentially stacked on the isolation layer on which a collector electrode, base electrode, and emitter electrode are provided respectively, an insulated isolation area formed on the collector layer outside the area where the compound semiconductor element is formed, a plug-shaped metal layer buried in an opening so formed in the insulated isolation area so as to expose the semiconductor substrate, an inter-layer dielectric layer stacked in the insulated isolation area and on the bipolar transistor element, a ground wiring layer formed on the inter-layer dielectric layer so as to connect the emitter electrode and the plug-shaped metal layer via a contact hole formed in the inter-layer dielectric layer, and a ground electrode formed on the back of the semiconductor substrate.

A method for manufacturing a semiconductor device according to the present invention comprises the steps of stacking isolation layers on a n-type or p-type semiconductor substrate doped in high density, sequentially stacking a collector layer, base layer, and emitter layer on the isolation layers, exposing the base layer and collector layer by mesa etching, forming a collector electrode, base electrode and emitter electrode on these layers respectively, forming an insulated isolation area in the collector layer outside the area where the bipolar transistor element is formed, forming an opening so as to expose the compound semiconductor substrate in the insulated isolation area, forming an ohmic contact electrode in the bottom of the opening, stacking an inter-layer dielectric layer in the periphery of the bipolar transistor element including the opening, forming openings in the inter-layer dielectric layer at the upper parts of the emitter electrode of the bipolar transistor element and the ohmic contact electrode, forming an buried wiring layer for connecting the emitter electrode and the ohmic contact electrode to each other via the openings, and forming a ground electrode on the back of the semiconductor substrate.

The method for manufacturing a semiconductor device according to the present invention comprises steps of stacking isolation layers on a n-type or p-type semiconductor substrate doped in high density, sequentially stacking a collector layer, base layer, and emitter layer on the isolation layers, exposing the base layer and collector layer by mesa etching, forming a collector electrode, base electrode and an emitter electrode on these layers respectively, forming an insulated isolation area in the collector layer outside the area where the bipolar transistor element is formed, forming an opening so as to expose the compound semiconductor substrate in the insulated isolation area, forming a substrate electrode in the bottom of the opening, stacking an insulating film on the surface of the bipolar transistor element including the opening, forming an opening at the upper part of the substrate electrode of the insulating film, stacking a metal layer on the substrate electrode by an electrolytic plating method via the opening and filling up to flatten the opening with the plug-shaped metal layer, stacking an inter-layer dielectric layer on the semiconductor substrate in the periphery of the semiconductor element including the opening where the plug-shaped metal layer is buried, forming in the inter-layer dielectric layer contact holes at the upper parts of the emitter electrode of the bipolar transistor element and the plug-shaped metal layer, forming an buried ground wiring layer for connecting the emitter electrode and substrate electrode to each other via the openings, and forming a ground electrode on the back of the semiconductor substrate.

Furthermore, the method for manufacturing a semiconductor device according to the present invention is characterized in that the plug-shaped metal layer is formed by the electrolytic plating method using the compound semiconductor substrate doped in high density where the substrate electrode is exposed as one of power supply layers.

Furthermore, the method for manufacturing a semiconductor device according to the present invention is characterized in that the ground wiring layer is formed by the electrolytic plating method using the compound semiconductor substrate doped in high density where the plug-shaped metal layer and the emitter electrode are exposed as one of power supply layers.

Furthermore, the method for manufacturing a of semiconductor device according to the present invention is characterized in that the semiconductor substrate is a compound semiconductor substrate, and the bipolar transistor element is a heterojuntion compound semiconductor element, and the insulated isolation area is formed by increasing the resistance of the collector layer by ion implantation.

Furthermore, the method for manufacturing a semiconductor device according to the present invention is characterized in that the inter-layer dielectric layer is formed by spin-coating resin.

DETAILED DESCRIPTION OF THE INVENTION

Preferred embodiments of the present invention in which the present invention is applied to a GaAs heterojunction bipolar transistor will be described in detail hereunder with reference to the accompanying drawings.

Figure 4:
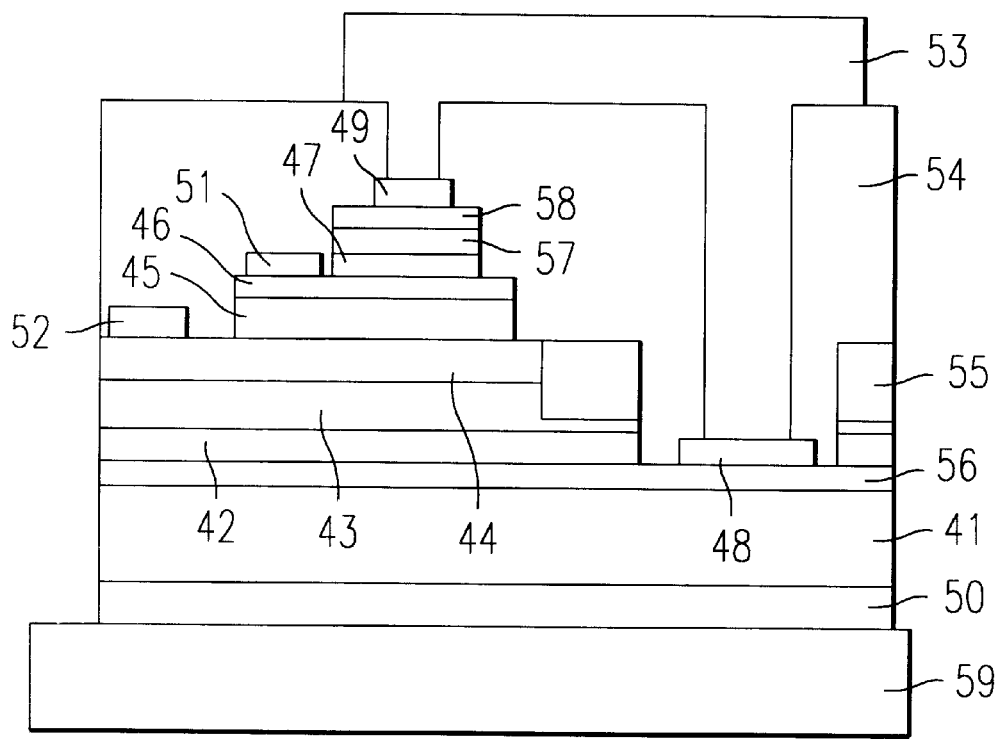
FIG. 4 is a cross sectional view showing a structure of an HBT according to the first embodiment of the present invention.

FIG. 4 is a cross sectional view showing the construction of an HBT, which is the first embodiment of the present invention. On an n-type GaAs substrate (41) of high density, a p-type GaAs layer (42) of high density with a thickness of 100 nm, a non-doping GaAs layer (43) with a thickness of 2 $\mu$m, an n-type GaAs layer (44) of high density with a thickness of 500 nm which is an buried collector layer, an n-type GaAs layer (45) of low density with a thickness of 700 nm which is a collector depletion layer, a p-type GaAs layer (46) of high density with a thickness of 60 nm which is a base layer, an n-type InGaP layer (47) with a thickness of 100 nm which is an emitter layer, an n-type GaAs layer (57) of high density with a thickness of 100 nm which is an emitter contact layer, and an n-type InGaAs layer (58) of high density with a thickness of 100 nm are stacked. On the back of the substrate (41), an electrode (50) is provided and connected to a ground conductor (59). An insulated isolation area (55) is formed on the collector layer (44) outside the element area, by increasing the resistance with ion implantation of boron. The depth of the high-resistance insulation area (55) is required to be deep enough to insulate the buried collector layer (44) at least perfectly and in the example shown in the drawing, it is almost 1 $\mu$m. In the high-resistance insulation area (55), a hole reaching the n-type substrate (41) is formed and a substrate electrode (48) connected to the n-type substrate (41) at the bottom is provided. An exposure area is provided on the buried collector layer (44) and the base layer (46) respectively by mesa etching and a collector electrode (52) and a base electrode (51) are formed thereon respectively. At the upper part of the emitter area, an emitter electrode (49) is provided. In a wiring inter-layer dielectric layer (54), a contact hole reached to each electrode is formed. Particularly, the present invention is characterized in that the emitter electrode (49) and the substrate electrode (48) are connected by a wiring layer (53) through the contact hole.

According to the construction of the present invention, the inductance of the wiring layer (53) can be made sufficiently smaller than that of wire bonding, so that the high-frequency power gain will not be reduced. When the wiring layer (53) is made thicker, heat generated in the element area is efficiently transferred to the electrode (48) via the wiring layer (53) and hence a secondary effect that the thermal resistance is lowered can be obtained.

Figure 5:
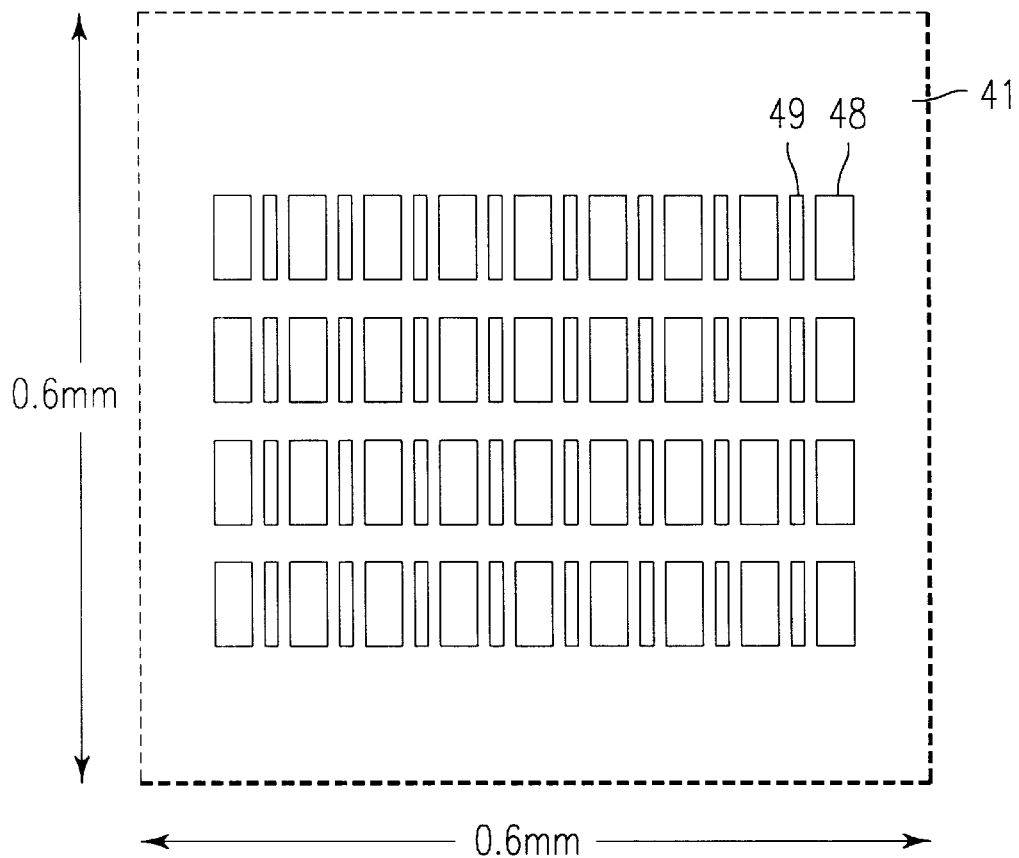
FIG. 5 is a plan view showing a structure of an HBT shown in FIG. 4.

FIG. 5 is a plane layout of a 2-GHz power transistor of output of 30 dBm using an HBT of the structure described above. To clearly understand the effect of the present invention, only the emitter electrode (49) and the substrate electrode (48) are shown. A number of 32 emitter electrodes (49) with a size of 5×30 $\mu$m are arranged at intervals of 60 $\mu$m and substrate electrodes (48) are arranged between the contiguous two emitter electrodes. As a result, the area of the chip 41 necessary to obtain an output of 30 dBm is 0.6×0.6 mm. The ground inductance of the chip is very small such as 0.02 nH and the power gain of 21 dB is obtained. Therefore, in the HBT of the present invention, compared with the conventional HBT shown in FIG. 1, extensive improvement of the power gain and reduction in the chip area can be realized.

Figure 6:
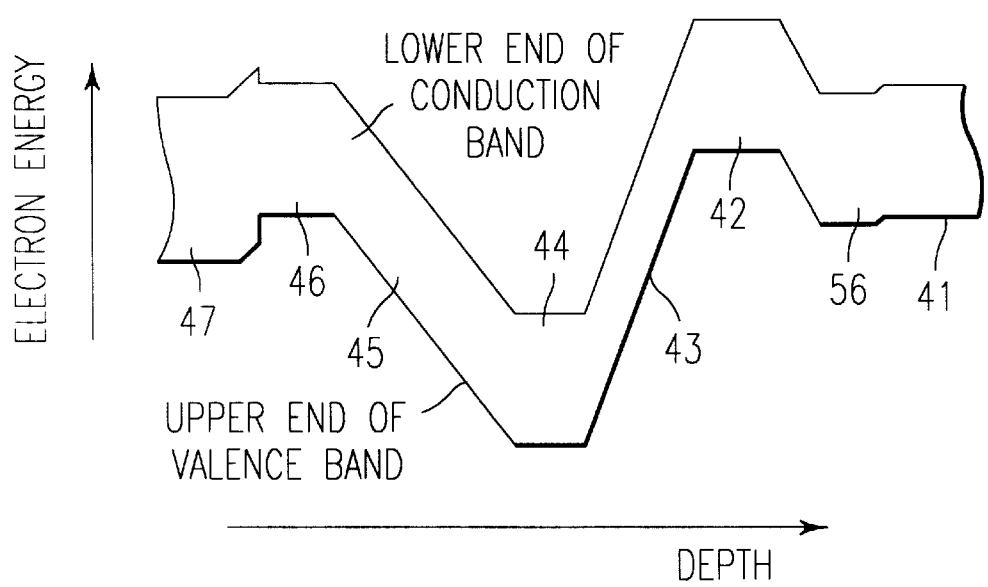
FIG. 6 is a band diagram of the HBT according to the first embodiment of the present invention.

A band diagram of the element is shown in FIG. 6. The structure is that an npn heterojunction bipolar transistor comprising the layers (44) to (47) performs high-frequency amplification and at the lower part thereof, a parasitic npn bipolar transistor comprising the layers (41) to (44) is formed. From the viewpoint of the DC characteristics, it is necessary that the withstand voltage of the parasitic npn bipolar transistor is higher than the desired operating voltage of the npn heterojunction bipolar transistor comprising the layers (44) to (47). To surely comply with this requirement, it is desirable to make the thickness of the non-doping GaAs layer (43) larger than the thickness of the collector layer (45) of low density so as to increase the withstand voltage of the pn junction comprising the layers (42) to (44).

Figure 7:
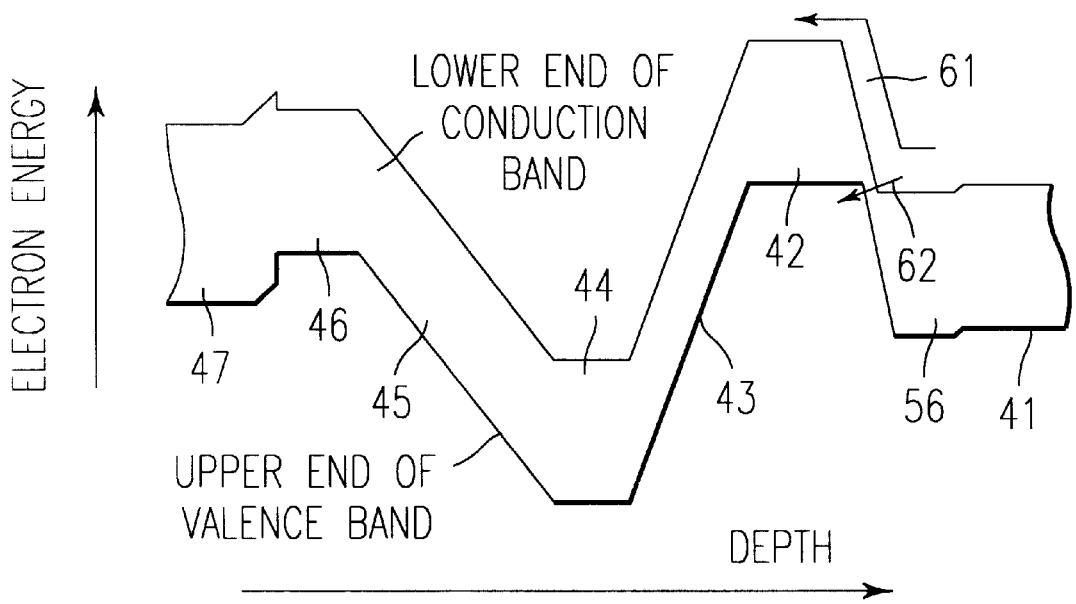
FIG. 7 is a band diagram of the HBT according to a modified example of the first embodiment of the present invention.

Furthermore, it is desirable to set the current gain of the parasitic npn bipolar transistor to a small value. Therefore, tunnel junction is formed by increasing the doping density of a n-type buffer layer (56) during growth and the high-density p-type layer (42). A band diagram that the buffer layer (56)

during growth and the high-density p-type layer (42) are subjected to tunnel junction is shown in FIG. 7. When the tunnel junction is formed, a diffusion current component (61) due to supply of electrons from the substrate is suppressed and the potentials of the layers (42) and (56) are fixed by a tunnel current (62). Therefore, the parasitic npn structure does not operate as a bipolar transistor any more and the withstand voltage of the parasitic diode can be surely set to a desired operating voltage or more. Since the potentials of the layers (42) and (56) are fixed, the electric characteristics are the same as those when a p-type substrate is used.

Figure 8:
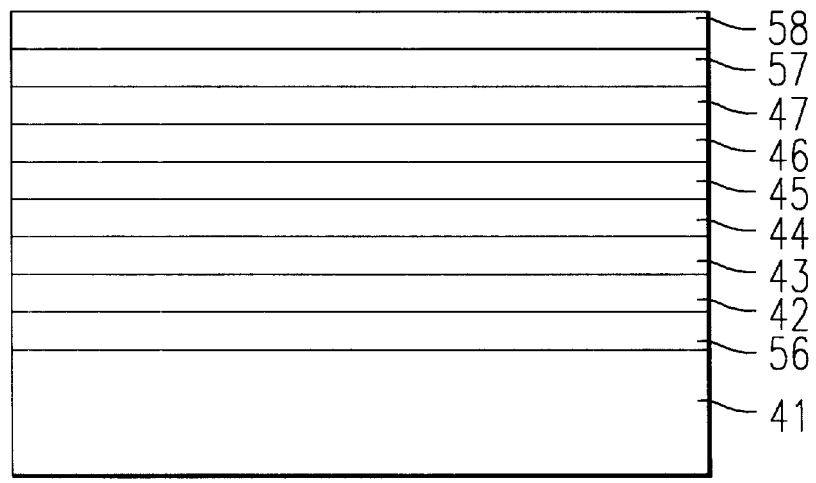
FIGS. 8 to 12 are cross sectional views showing the manufacturing method of the HBT according to the first embodiment of the present invention.

In the next, a method for manufacturing HBT shown in FIG. 4 will be explained by referring to FIGS. 8 to 12. On the n-type GaAs substrate (41) where $3\times10^{18}$ cm$^{-3}$ of Si is doped, using the MOCVD method, the following layers are sequentially grown (FIG. 8). The n-type GaAs layer (56) with a thickness of 200 nm where $5\times10^{18}$ cm$^{-3}$ of Si is doped, the p-type GaAs layer (42) with a thickness of 100 nm where $5\times10^{19}$ cm$^{-3}$ of C is doped, the non-doping GaAs layer (43) with a thickness of 2 μm, the n-type GaAs layer (44) with a thickness of 500 nm where $5\times10^{18}$ cm$^{-3}$ of Si is doped, the n-type GaAs layer (45) with a thickness of 700 nm where $1\times10^{16}$ cm$^{-3}$ of Si is doped, the p-type GaAs layer (46) with a thickness of 600 nm where $5\times10^{19}$ cm$^{-3}$ of C is doped, the n-type InGaP layer (47) with a thickness of 100 nm where $5\times10^{17}$ cm$^{-3}$ of Si is doped, the n-type GaAs layer (57) with a thickness of 100 nm where $5\times10^{18}$ cm$^{-3}$ of Si is doped, and the n-type InGaAs layer (58) with a thickness of 100 nm where $5\times10^{19}$ cm$^{-3}$ of Si is doped. The epitaxial growth by the MOCVD method can be executed at a comparatively low temperature such as about 600° C., while the Si epitaxial growth is executed at a high temperature such as 900° C. to 1000° C. or more. Therefore, the problem that impurities of the high-density layer are diffused in the low-density layer and the profile cannot be controlled can be avoided.

Figure 9:
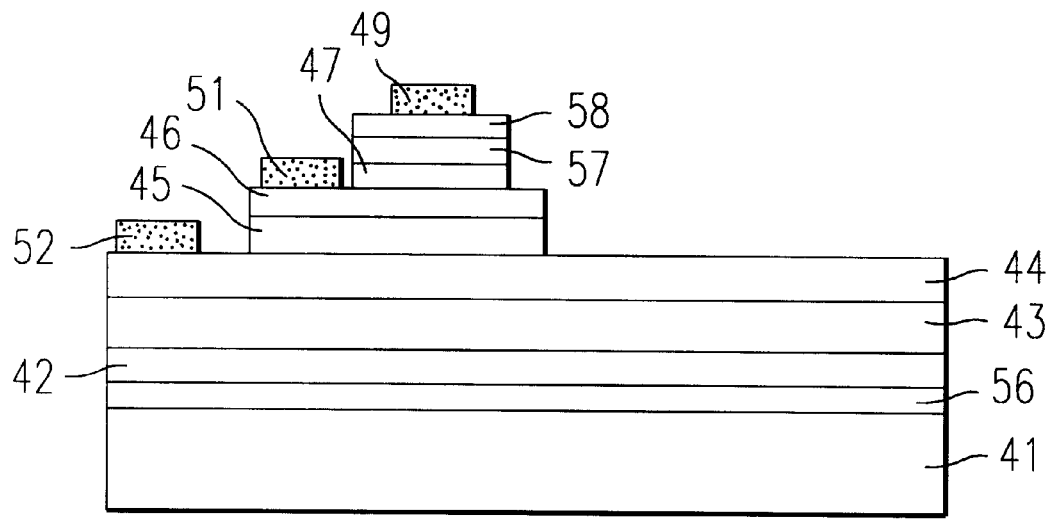

Then, the base layer (46) and the collector layer (44) are exposed by the mesa etching process using the master pattern. The emitter electrode (49), the base electrode (51), and the collector electrode (52) are formed on n-type InGaAs layer (58) and collector layer (44) respectively (FIG. 9).

Figure 1:
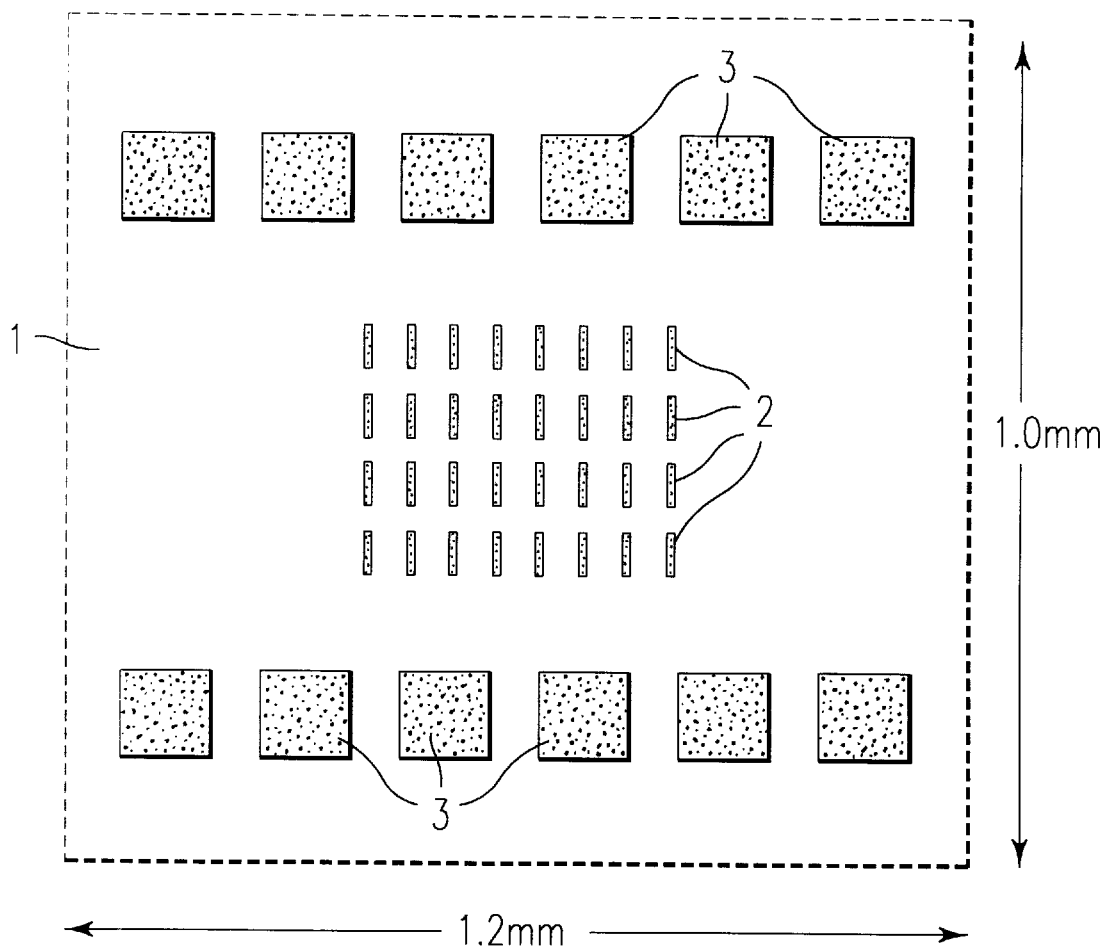
FIG. 1 is a plan view showing a structure of an HBT of the prior art.
Figure 2:
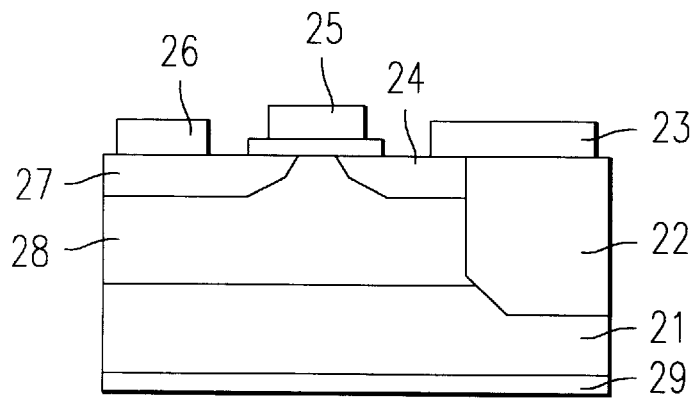
FIG. 2 is a cross sectional view showing a structure of conventional high-frequency power MOSFET.
Figure 3:
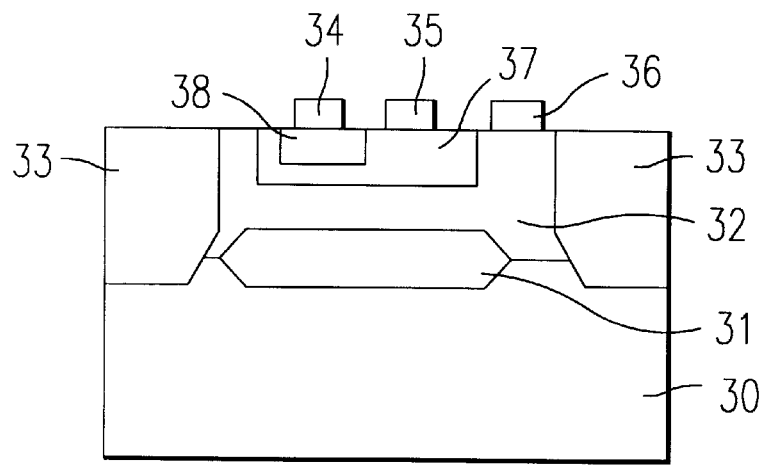
FIG. 3 is a cross sectional view showing a structure of a conventional high-frequency bipolar transistor.
Figure 10:
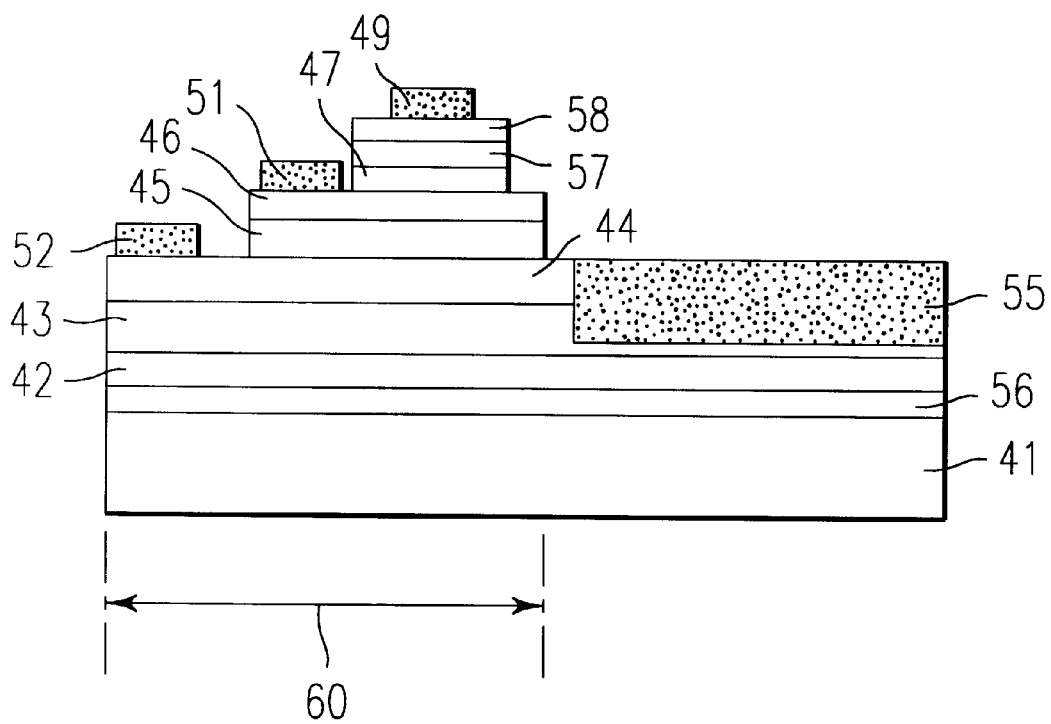
Figure 11:
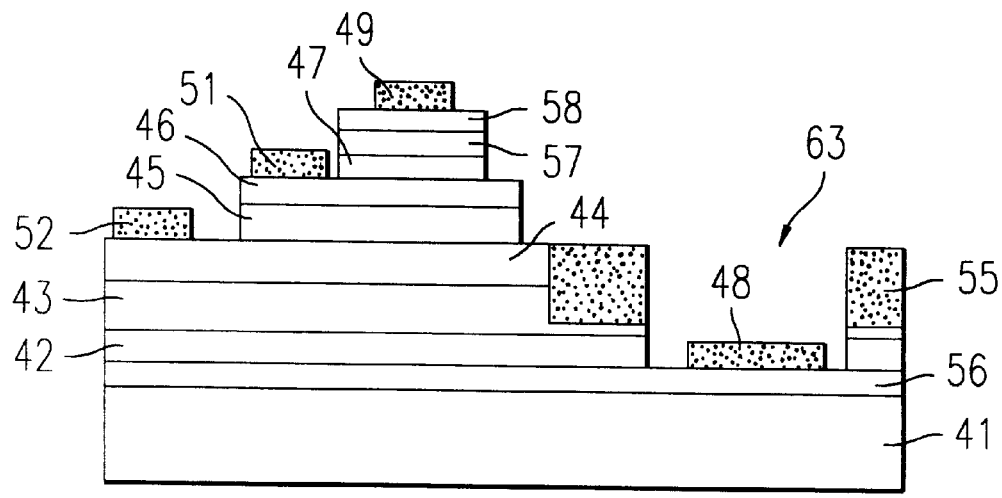
Figure 12:
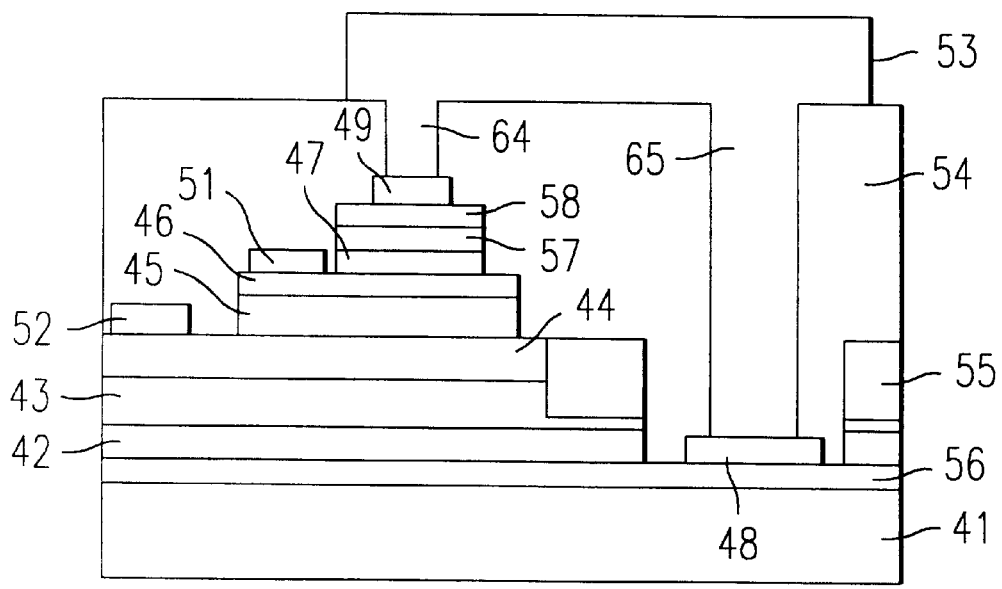

In the next, isolation area (55) for isolating element area (60) from the other area is formed by increasing the resistance of the collector layer (44) other than the element area (50) by ion implantation of boron (FIG. 10). The ion implantation is used to increase the resistance of the collector layer (44) by destroying crystals thereof. Thus, not only boron but also helium or argon may be used. The thickness of the separate area (55) goes beyond the thickness of the buried collector layer (44) and reaches inside the non-doping GaAs layer (43) under it. In the isolation area (55), an opening (63) is formed by etching, with a depth of 3 μm in the direction of the thickness reaching the n-type substrate (41). Substrate electrode (48) is then formed in the bottom (FIG. 11). Then, on the n-type GaAs substrate (41) including the element area (50) and the opening (63), a BCB (benzocyclobutene) film is coated overall the substrate including the HBT element by spin coating and is cured. Thus, the whole HBT element is buried and the inter-layer dielectric layer (54) having an almost flat top is formed. Thereafter, from the top of the inter-layer dielectric layer (54), contact holes (64) and (65) for exposing the HBT emitter electrode (49) and the substrate electrode (48) are respectively formed by etching. Ground wiring layer (53) for electrically connecting the emitter electrode (49) and the substrate electrode (48) is formed via the contact holes (64) and (65) by the plating method. Thereafter, the n-type substrate (41) is lapping-ground to a desired thickness, and the electrode (50) is formed on the back of substrate (41). The element having structure shown in FIG. 1 is thus completed.

According to the manufacturing method described, the wiring layer (53) for electrically connecting the emitter electrode (49) and the substrate electrode (48) is formed by the plating method and the substrate electrode (48) formed on the n-type substrate (41) in the isolation area (55) for isolating the element area (50) from the other part is formed by the CVD method, so that upper diffusion of impurities included in the substrate which is a problem in Si-MOSFET will not be generated.

In the first embodiment aforementioned, though the n-type GaAs substrate (41) is used, Si which is donor impurities of the n-type substrate (41) has an extremely small diffusion factor and hence will not generate diffusion of impurities during epitaxial growth, which is a problem in Si-MOSFET. Furthermore, carbon which is an acceptor used for MOCVD growth also has an extremely small diffusion factor. Therefore, a bipolar transistor having an buried collector layer for surely realizing the thickness of the non-doping GaAs layer (43) as designed can be formed on an epitaxial layer having a low impurity density. Since only one epitaxial growth may be executed from the substrate to the transistor layers, an increase in the process cost can be saved.

Figure 13:
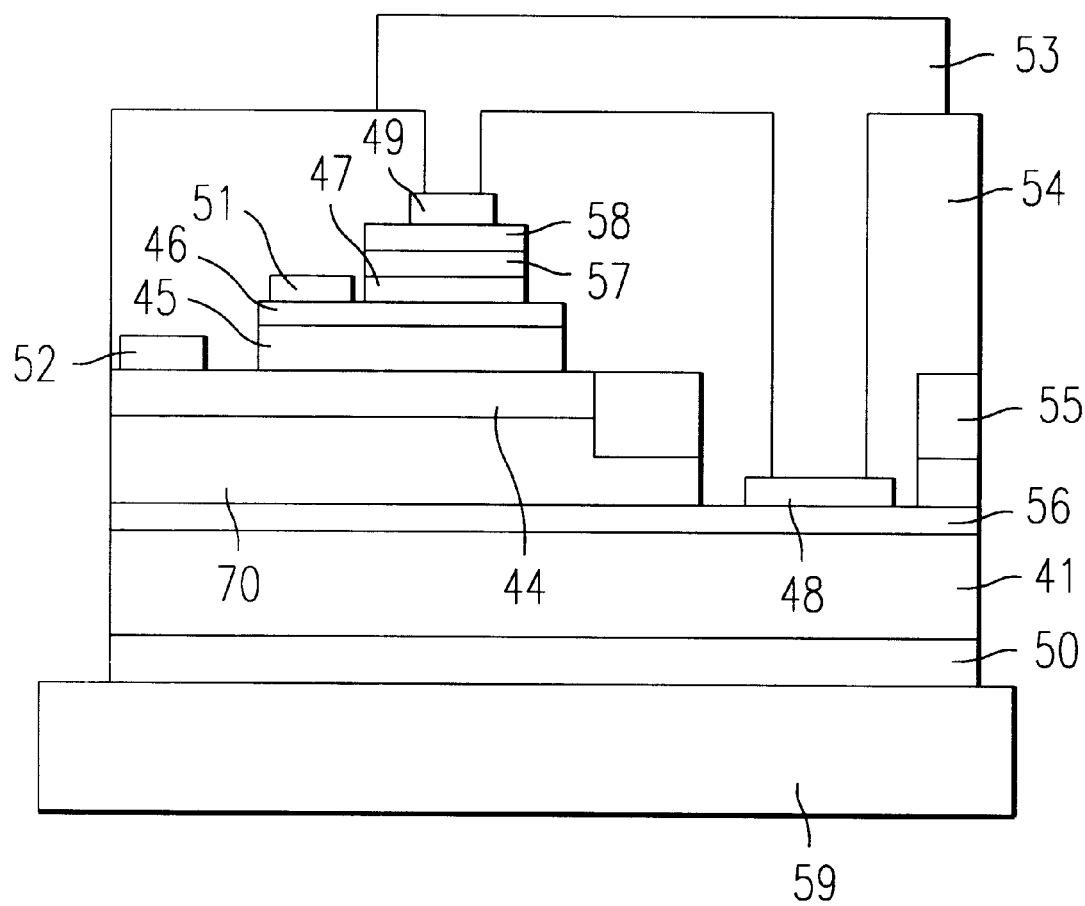
FIG. 13 is a cross sectional view showing a structure of an HBT according to the second embodiment of the present invention.
Figure 14:
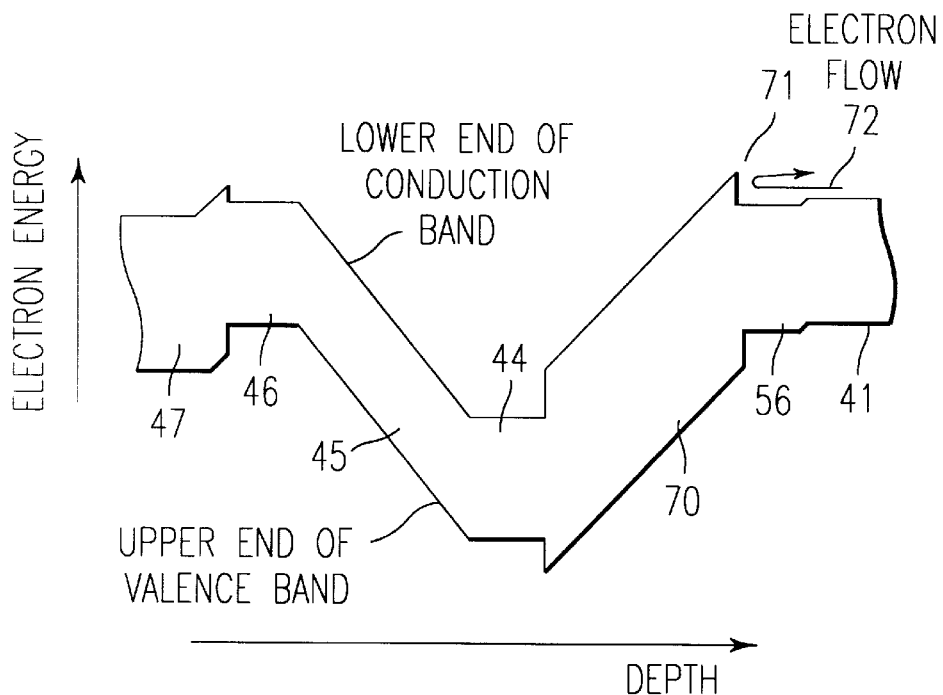
FIG. 14 is a band diagram of the HBT according to the second embodiment of the present invention.

FIG. 13 is a cross sectional view showing the structure of an HBT, which is the second embodiment of the present invention. In the drawing, the same numeral is assigned to each of the same parts, as those shown in FIG. 4 and the detailed explanation will be omitted. A difference of the embodiment from the first one is that an InGaP layer (70) having a large band-gap energy is formed between the n-type GaAs buffer layer (56) on the n-type substrate (41) and the buried collector layer (44). A band diagram of this structure is shown in FIG. 14. As clearly shown in the drawing, diffusion of electrons from the substrate (41) is prevented by a heterobarrier (71) as shown by an arrow (72) due to the InGaP layer (70) so that the buried collector layer (44) and the substrate (41) are separated electrically. The other effects of this embodiment are the same as those of the first embodiment.

Figure 15:
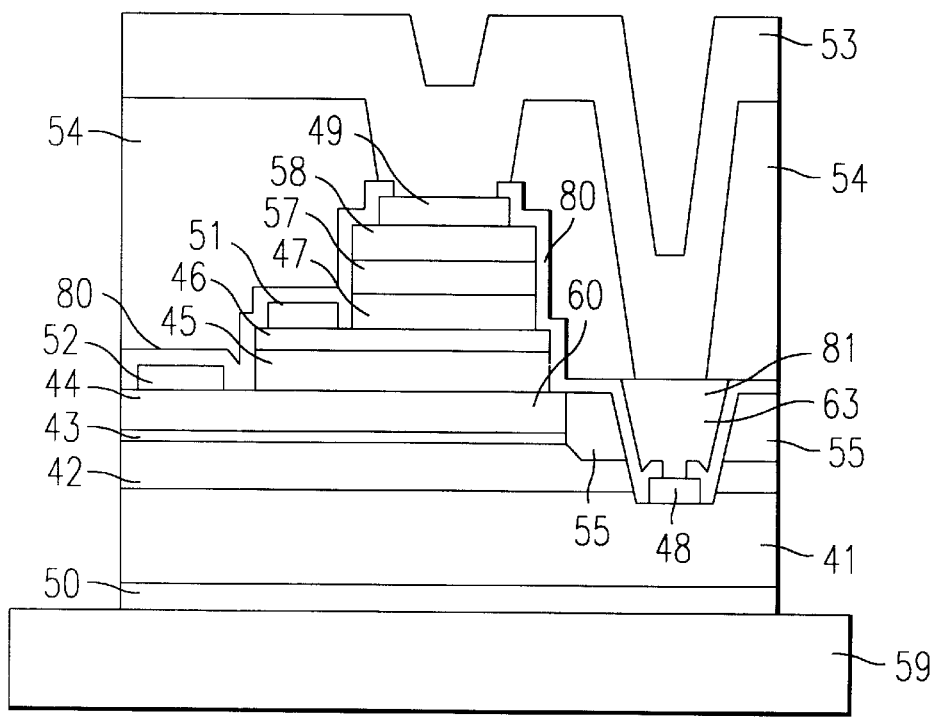
FIG. 15 is a cross sectional view showing a structure of an HBT according to the third embodiment of the present invention.

FIG. 15 is a cross sectional view showing the structure of an HBT, which is the third embodiment of the present invention. In the drawing, the same numeral is assigned to each of the same or corresponding parts as those shown in FIG. 4.

On the p-type GaAs substrate (41) having introduced impurities in high density, the following layers are sequentially stacked; the p-type GaAs layer 42 with a thickness of 200 nm having impurity density of $5\times10^{19}$ cm$^{-3}$, the non-doping GaAs layer (43) with a thickness of 2 m, the n-type GaAs layer (44) with a thickness of 500 nm having impurity density of $5\times10^{18}$ cm$^{-3}$ which is an buried collector layer, the n-type GaAs layer (45) with a thickness of 500 nm having impurity density of $1\times10^{16}$ cm$^{-3}$ which is a collector depletion layer, the p-type GaAs layer (46) with a thickness of 60 nm having impurity density of $4\times10^{19}$ cm$^{-3}$ which is a base layer, the n-type InGaP layer (47) with a thickness of 100 nm having impurity density of $5\times10^{17}$ cm$^{-3}$ which is an emitter layer, the n-type GaAs layer (57) with a thickness of 100 nm having impurity density of $5\times10^{18}$ cm$^{-3}$ which is an emitter contact layer, and the n-type InGaAs layer (58) with a thickness of 100 nm having impurity density of $3\times10^{19}$ cm$^{-3}$ which is also an emitter contact layer. On the back of the p-type GaAs substrate (41), the ground electrode (50) formed by stacking Pt, Ti, and Au sequentially is provided and connected to the ground conductor (59) of the mounting board (not shown).

In the collector layer (44) outside the element area, ion implantation of boron is executed, so that the resistance of the area is increased. Thus each element is electrically separated with each other. Therefore, it is necessary to form the high-resistance isolation area (55) deep enough, at least, to completely insulate the buried collector layer (44). According to the embodiment described, the resistance of a depth of about 1 $\mu$m reaching the p-type GaAs layer (42) and the non-doping GaAs layer (43) under the collector layer (44) is increased. An opening (63), which reaches p-type substrate (41), is formed in high-resistance area (55) by etching. Substrate electrode (48) wherein Pt, Mo, and Au are sequentially stacked is formed at the bottom of opening (63).

An exposure area is formed on the top of each of the buried collector layer (44) and base layer (46) by mesa etching. Collector electrode (52) wherein AuGe, Ni, and Au are stacked and the base electrode (51) wherein Pt, Mo, and Au are stacked are formed on collector layer (44) and base layer (46) respectively. At the upper part of the emitter contact layer (58), emitter electrode (49) wherein Pt, Mo, and Au are stacked is provided. The surface of the transistor (60) is covered with a SiO$_2$ film (80) with a thickness of 200 nm as a surface protective layer. In a SiO$_2$ film (80), a contact holes (not shown in the drawing) are formed on each electrode part by etching. On the other hand, using the substrate electrode (48) provided in the bottom of the opening (63) as a starting point, a plug-shaped metal layer (81) is formed by electrolytic plating. The plug-shaped metal layer (81) is filled up in the opening (63) and the surface thereof is almost equal to the surface of element forming area (60) in height so as to be flattened. On the semiconductor substrate (41) including the HBT element forming area (60) and the insulated isolation area (55), the inter-layer dielectric layer (54) comprising a BCB film is stacked. The inter-layer dielectric layer (54) is stacked up to the upper part of the HBT element and formed so as to have a flat surface parallel with the semiconductor substrate (41) as a whole. Ground-wiring layer (53) connects emitter electrode (49) and plug-shaped metal layer (81) via the contact hole formed in the inter-layer dielectric layer (54). To the HBT electrodes other than emitter electrode, a wiring layer corresponding to each electrode is connected respectively (not shown).

According to the third embodiment of the present invention, as is the case with the first and second embodiments, the inductance by the ground wiring and through hole metal layer is extremely low, so that low ground inductance can be realized compared with the grounding method by wire bonding. Since there is no need to install a bonding pad, the chip area can be reduced and a reduction in chip cost is realized. In addition, since it is possible to pull out heat generated in the element area outside by the ground wiring layer and transfer it up to the metal layer buried deep in the substrate, an effect can be produced that the heat radiation efficiency is enhanced and the heat resistance is lowered.

The chip size of the 2-GHz band power amplifier of output of 30 dBm made using the HBT of this embodiment is 0.6×0.6 mm. In this case, 32 emitter electrodes with a size of 5×30 $\mu$m are arranged at intervals of 60 $\mu$m. Grounding openings are formed in each of the intervals of 60 $\mu$m in a size of 20×25 $\mu$m to which ground wires are connected. The ground inductance of this chip is 0.02 nH and the power gain is 21 dB. The thermal resistance is 45 KW in a power amplifier made using the HBT of the present invention, while it is 60 KW in a power amplifier that ground wires are formed using wire bonding. From the fact, it is understood that the HBT of the present invention can reduce the effect of self-heat generation.

Figure 16:
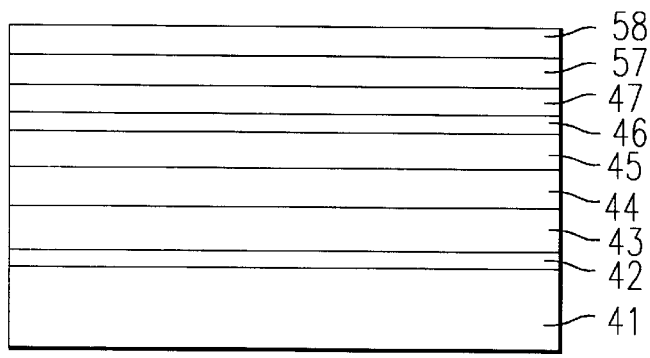
FIGS. 16 to 23 are cross sectional views showing the manufacturing method of the HBT according to the third embodiment of the present invention.

In the next, a method for manufacturing HBT shown in FIG. 15 will be explained by referring to FIGS. 16 to 23. On a p-type GaAs substrate (41) introducing $2\times10^{19}$ cm$^{-3}$ of Zn, a p-type GaAs layer (42) with a thickness of 200 nm introducing $5\times10^{19}$ cm$^{-3}$ of C, a non-doping GaAs layer (43) with a thickness of 2 $\mu$m, a n-type GaAs collector layer (44) with a thickness of 500 nm introducing $5\times10^{18}$ cm$^{-3}$ of Si, a n-type GaAs layer (45) with a thickness of 500 nm introducing $1\times10^{16}$ cm$^{-3}$ of Si, a p-type GaAs layer (46) with a thickness of 60 nm introducing $4\times10^{19}$ cm$^{-3}$ of C, a n-type InGaP base layer (47) with a thickness of 100 nm introducing $5\times10^{17}$ cm$^{-3}$ of Si, a n-type GaAs emitter layer (57) with a thickness of 100 nm introducing $5\times10^{18}$ cm$^{-3}$ of Si, and a n-type InGaAs emitter layer (58) with a thickness of 100 nm introducing $5\times10^{19}$ cm$^{-3}$ of Si are grown with the epitaxial growth at a time by a MOCVD method (FIG. 16).

Figure 17:
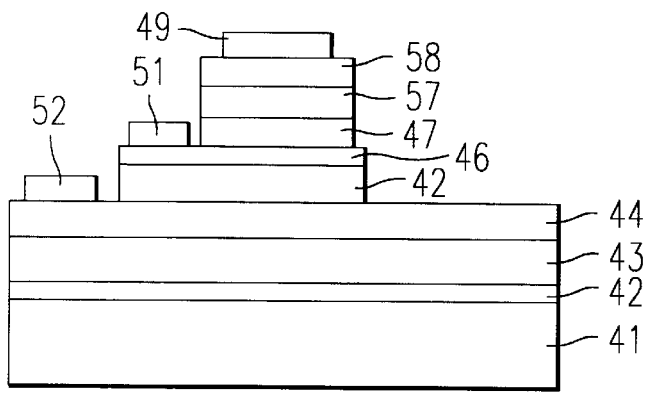

On the tops of the collector layer (44) and the base layer (47), an exposure area is formed respectively by mesa etching and on these exposure areas, the collector electrode (52) wherein AuGe, Ni, and Au are sequentially stacked, the base electrode (51) wherein Pt, Mo, and Au are sequentially stacked, and the emitter electrode (49) are formed on emitter layer (58) (FIG. 17).

Figure 18:
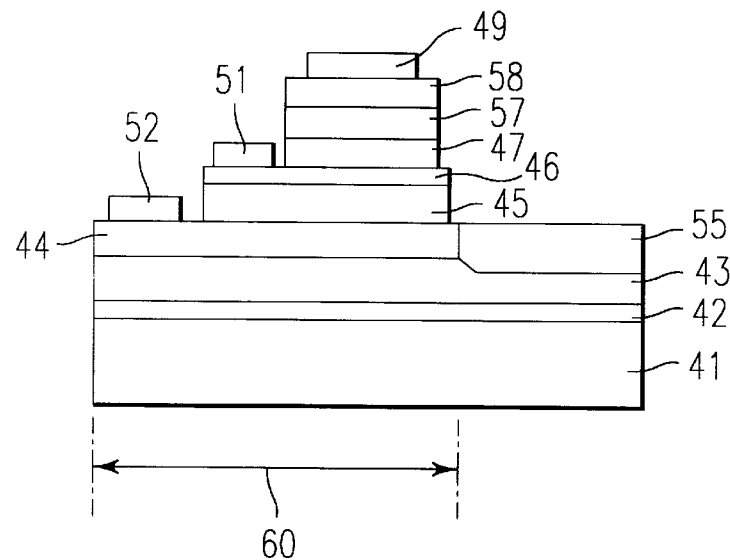
Figure 19:
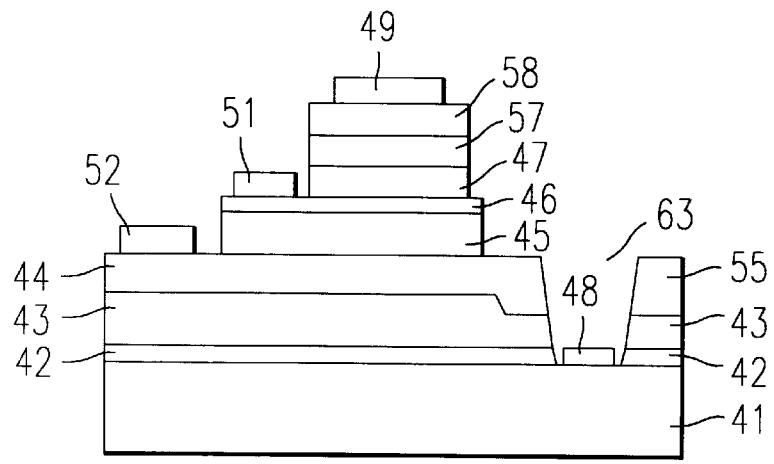

Then, the resistance of the buried collector layer (44) outside element area (60) is increased by ion implantation of boron and the isolation area (55) is formed (FIG. 18). An opening (63) with a depth of about 2 $\mu$m is formed in the high-resistance isolation area (55) so as to reach the p-type substrate (41) by wet etching at the bottom of the opening (63), a substrate electrode (48) wherein Pt, Ti, Pt, and Au are sequentially stacked is formed. Thereafter, the annealing process is performed at 370° C. for one minute in a nitrogen environment so that an ohmic contact is formed. With this process, an interface between the electrodes and semiconductor are stabilized (FIG. 19).

Figure 20:
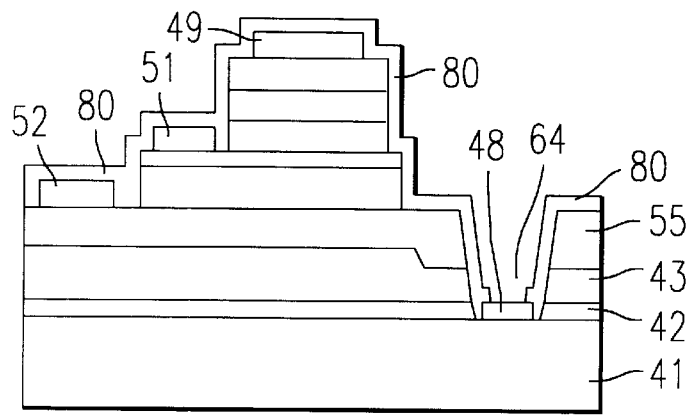
Figure 21:
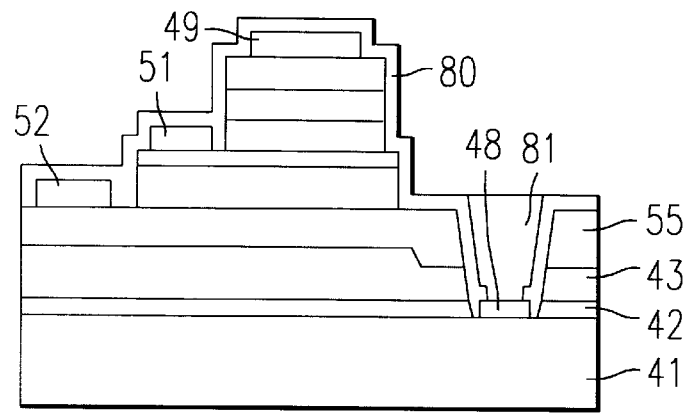

In the next, a SiO$_2$ film (80) with a thickness of 200 nm is formed overall by the thermal CVD method and the opening (64) is formed in SiO$_2$ film (80) at substrate electrode (48) by etching (FIG. 20). In this state, a wafer, i.e. substrate (41), is immersed in the gold plating bath, and power is supplied to the whole p-type GaAs substrate (41) from a large substrate electrode (not shown in the drawing) provided in the periphery of the wafer, with which gold plating is performed. Wit this arrangement, only on the substrate electrode (48) on which opening (63) is formed in the SiO$_2$ film, a gold plating layer is formed. When the thickness of the gold plating layer is chosen as about 2 $\mu$m which is the depth of the opening (63), the opening (63) formed in substrate (41) is filled up to be flattened with the plating layer and plug-shaped metal layer (81) is formed (FIG. 21).

Figure 22:
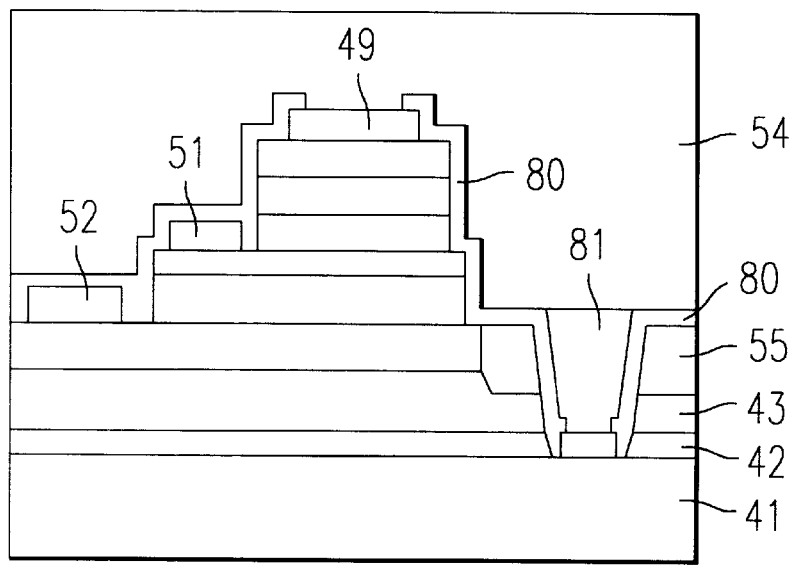
Figure 23:
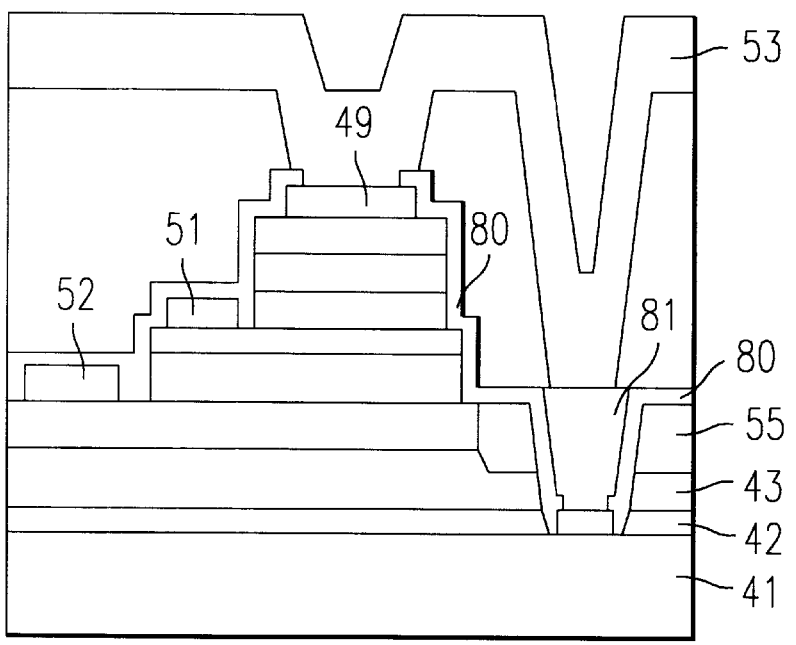

Then, in the SiO$_2$ films (80) at the part of the emitter electrode (49), the base electrode (51), and the collector electrode (52), contact holes are formed and a first level wiring layer is formed by the vacuum evaporation method (not shown in the drawing). Thereafter, a BCB film is formed overall with a thickness of about 1 $\mu$m by the spin coating method, which becomes the inter-layer dielectric layer (54) under the wiring layer of a second level (FIG. 22). Then, in the inter-layer dielectric layer (54) between emitter layer (49) and plug-shaped metal layer (81) formed by gold plating, a contact hole is formed. Substrate (41) is immersed in the gold plating bath in the same way as with the aforementioned so that the ground wiring layer (53) as the second level wiring layer is formed by gold plating (FIG. 23). Thereafter, the substrate (41) is lapping-ground to a desired thickness, and the electrode (50) is formed on the back of the substrate. The HBT structure shown in FIG. 15 is thus completed.

According to the manufacturing method described, the gold plating flattens the surface of the wafer by filling up deep opening (63) reaching the p-type substrate. As a result, the subsequent processes of forming a contact hole in the inter-layer dielectric layer (54) and of plating the wiring layer can be easily performed because the contact hole depth becomes shallow, e.g. almost 1 μm which is the thickness of the inter-layer dielectric layer (54).

Also in the process of filling up the opening (63) by gold plating, since power is supplied from the substrate, a plating layer is automatically formed on the substrate electrode with requiring no specially complicated process, there is hardly an excessive increase in the process cost.

Though in the manufacturing method described, the power for plating is supplied from a substrate electrode provided on the substrate surface, the power can be directly supplied from the back of the substrate. With this method, the chip yield for the electrode area for power supply increases and the chip cost can be reduced more.

According to the present invention explained above, by use of a conductive substrate as a ground conductor, ground wires by means of wire bonding are eliminated and low ground inductance can be realized, and thus a power amplifier HBT of high gain can be realized at a low cost. Furthermore, according to the manufacturing method of the present invention, a high-performance power amplifier can be easily realized using an equivalent process to the conventional one.

In the aforementioned embodiments, it is desirable that each of a plurality of transistors formed on the same semiconductor substrate has emitter connected to the ground. However, it is easy as an art within the scope of the present invention to integrate some of a plurality of transistor elements having an emitter electrode that is not connected to the ground together with the emitter grounded transistors. For example, a power amplifier IC having a built-in bias circuit can be incorporated.

What is claimed is:

1. A semiconductor device comprising:
   a conductive compound semiconductor substrate that impurities are doped in high density;
   an isolation layer stacked on the substrate;
   a bipolar transistor element that a collector layer, base layer, and emitter layer are sequentially stacked on the isolation layer and that a collector electrode, base electrode, and emitter electrode are provided on the respective layers;
   an insulated isolation layer formed on the compound semiconductor substrate outside the area where the bipolar transistor element is formed; and
   a ground wiring layer for electrically connecting the emitter electrode of the bipolar transistor element and the compound semiconductor substrate via a contact hole formed in the insulated isolation layer.

2. A semiconductor device according to claim 1, wherein said bipolar transistor element comprises a compound semiconductor having heterojunction and the band-gap energy of said emitter layer is wider than the band-gap energy of said base layer.

3. A semiconductor device according to claim 1, wherein said compound semiconductor substrate includes p-type or n-type impurities.

4. A semiconductor device according to claim 1, wherein said isolation layers comprise reverse bias P-N junction when said compound semiconductor substrate is of an n type.

5. A semiconductor device according to claim 1, wherein said isolation layers comprise reverse bias P-N junction having the tunnel effect when said compound semiconductor substrate is of a n type.

6. A semiconductor device according to claim 1, wherein said isolation layers comprise a non-dope semiconductor layer when said compound semiconductor substrate is of a p type.

7. A semiconductor device according to claim 1, wherein the emitter layer is a n-type semiconductor layer, the base layer is a p-type semiconductor layer doped in high density, and the collector layer is a n-type semiconductor layer doped in high density.

8. A semiconductor device according to claim 1, wherein said insulated isolation area is an area that the resistance is increased by ion implantation into the collector layer.

9. A semiconductor device according to claim 1, wherein said bipolar transistor element has heterojunction and is formed in a mesa shape.

10. A semiconductor device according to claim 1, wherein a plurality of said transistor elements is arranged on said semiconductor substrate and said contact hole for ground connection is formed in the area between said pluralities of transistor elements.

11. A semiconductor device comprising:
    a n-type semiconductor substrate doped in high density;
    a p-type semiconductor layer stacked on the semiconductor substrate;
    a n-type collector layer doped in high density which is stacked on the p-type semiconductor layer;
    a p-type base layer doped in high density which is stacked on the collector layer;
    a n-type emitter layer stacked on the base layer;
    a collector electrode formed on the collector layer;
    a base electrode formed on the base layer;
    an emitter electrode formed on the emitter layer;
    an insulated isolation area formed on the collector layer outside an area where a bipolar transistor element is formed including said collector layer, base layer, and emitter layer;
    a substrate electrode formed on the semiconductor substrate in an opening formed in the insulated isolation area;
    an inter-layer dielectric layer stacked on the insulated isolation area and on the bipolar transistor element;
    a ground wiring layer formed on the inter-layer dielectric layer so as to connect the emitter electrode and the substrate electrode via a contact hole formed in the inter-layer dielectric layer; and
    a ground electrode formed on the back of the semiconductor substrate.

12. A semiconductor device comprising:
    a n-type semiconductor substrate doped in high density;

a p-type semiconductor layer doped in high density which is stacked on the semiconductor substrate;

a n-type collector layer doped in high density which is stacked on the p-type semiconductor layer;

a p-type base layer doped in high density which is stacked on the collector layer;

a n-type emitter layer stacked on the base layer;

a collector electrode formed on the collector layer;

a base electrode formed on the base layer;

an emitter electrode formed on the emitter layer;

an insulated isolation area formed on the collector layer outside an area where a bipolar transistor element is formed including said collector layer, base layer, and emitter layer;

a substrate electrode formed on the semiconductor substrate in an opening formed in the insulated isolation area;

an inter-layer dielectric layer stacked on the insulated isolation area and on the bipolar transistor element;

a ground wiring layer formed on the inter-layer dielectric layer so as to connect the emitter electrode and the substrate electrode via a contact hole formed in the inter-layer dielectric layer; and a ground electrode formed on the back of the semiconductor substrate, wherein the said n-type semiconductor substrate doped in high density and the p-type semiconductor substrate doped in high density which is stacked on the substrate form a tunnel junction.

13. A semiconductor device comprising:

a n-type semiconductor substrate doped in high density;

a semiconductor layer stacked on the semiconductor substrate;

a n-type collector layer doped in high density which is stacked on the semiconductor layer;

a p-type base layer doped in high density which is stacked on the collector layer;

a -type emitter layer stacked on the base layer;

a collector electrode formed on the collector layer;

a base electrode formed on the base layer;

an emitter electrode formed on the emitter layer;

an insulated isolation area formed on the collector layer outside an area where a bipolar transistor element is formed including said collector layer, base layer, and emitter layer;

a substrate electrode formed on the semiconductor substrate in an opening formed in the insulated isolation area;

an inter-layer dielectric layer stacked on the insulated isolation area and on the bipolar transistor element;

a ground wiring layer formed on the inter-layer dielectric layer so as to connect the emitter electrode and the substrate electrode via a contact hole formed in the inter-layer dielectric layer; and a ground electrode formed on the back of the semiconductor substrate;

wherein at least a part of said semiconductor layer includes a semiconductor layer such that the band-gap energy thereof is larger than the band-gap energy of the n-type semiconductor substrate doped in high density.

14. A semiconductor device according to claim 13, wherein said semiconductor layer is a non-doped semiconductor layer.

15. A semiconductor device comprising:

a p-type semiconductor substrate doped in high density;

a non-doping semiconductor layer stacked on the semiconductor substrate;

a n-type collector layer doped in high density which is stacked on the non-doping semiconductor layer;

a p-type base layer doped in high density which is stacked on the collector layer;

a n-type emitter layer stacked on the base layer;

a collector electrode formed on the collector layer;

a base electrode formed on the base layer;

an emitter electrode formed on the emitter layer;

an insulated isolation area formed on the collector layer outside an area where a bipolar transistor element is formed including said collector layer, base layer, and emitter layer;

a substrate electrode formed on the semiconductor substrate in an opening formed in the insulated isolation area;

an inter-layer dielectric layer stacked on the insulated isolation area and on the bipolar transistor element;

a ground wiring layer formed on the inter-layer dielectric layer so as to connect the emitter electrode and the substrate electrode via a contact hole formed in the inter-layer dielectric layer; and a ground electrode formed on the back of the semiconductor substrate.

16. A semiconductor device comprising:

a n-type or p-type compound semiconductor substrate doped in high density;

an isolation layer stacked on the substrate;

a compound semiconductor transistor element that a collector layer, base layer, and emitter layer are sequentially stacked on the isolation layer on which a collector electrode, base electrode, and emitter electrode are provided respectively;

an insulated isolation area formed on the collector layer outside the area where the compound semiconductor element is formed;

a plug-shaped metal layer buried in an opening so formed in the insulated isolation area so as to expose the semiconductor substrate;

an inter-layer dielectric layer stacked in the insulated isolation area and on the bipolar transistor element;

a ground wiring layer formed on the inter-layer dielectric layer so as to connect the emitter electrode and the plug-shaped metal layer via a contact hole formed in the inter-layer dielectric layer; and a ground electrode formed on the back of the semiconductor substrate.

17. A method for manufacturing a semiconductor device comprising the steps of:

stacking isolation layers on an n-type or p-type semiconductor substrate doped in high density;

sequentially stacking a collector layer, base layer, and emitter layer on the isolation layers;

exposing the base layer and collector layer by mesa etching;

forming a collector electrode, base electrode and emitter electrode on said layers respectively;

forming an insulated isolation area in the collector layer outside the area where the bipolar transistor element is formed;

forming an opening so as to expose the compound semiconductor substrate in the insulated isolation area;

forming an ohmic contact electrode in the bottom of the opening;

stacking an inter-layer dielectric layer in the periphery of the bipolar transistor element including the opening;

forming openings in the inter-layer dielectric layer at the upper parts of the emitter electrode of the bipolar transistor element and the ohmic contact electrode;

forming an buried wiring layer for connecting the emitter electrode and the ohmic contact electrode to each other via the openings; and forming a ground electrode on the back of the semiconductor substrate.

18. A method for manufacturing a semiconductor device comprising the steps of:

stacking isolation layers on a n-type or p-type semiconductor substrate doped in high density;

sequentially stacking a collector layer, base layer, and emitter layer on the isolation layers;

exposing the base layer and collector layer by mesa etching;

forming a collector electrode, base electrode and an emitter electrode on said layers respectively;

forming an insulated isolation area in the collector layer outside the area where the bipolar transistor element is formed;

forming an opening so as to expose the compound semiconductor substrate in the insulated isolation area;

forming a substrate electrode in the bottom of the opening;

stacking an insulating film on the surface of the bipolar transistor element including the opening;

forming an opening at the upper part of the substrate electrode of the insulating film;

stacking a metal layer on the substrate electrode by the electrolytic plating method via the opening and filling up to flatten the opening with the plug-shaped metal layer;

stacking an inter-layer dielectric layer on the semiconductor substrate in the periphery of the semiconductor element including the opening where the plug-shaped metal layer is buried;

forming in the inter-layer dielectric layer contact holes at the upper parts of the emitter electrode of the bipolar transistor element and the plug-shaped metal layer;

forming an buried ground wiring layer for connecting the emitter electrode and substrate electrode to each other via the openings; and forming a ground electrode on the back of the semiconductor substrate.

19. A method for manufacturing a semiconductor device according to claim 18, wherein said plug-shaped metal layer is formed by an electrolytic plating method using the compound semiconductor substrate doped in high density where the substrate electrode is exposed as one of power supply layers.

20. A method for manufacturing a semiconductor device according to claim 18, wherein said ground wiring layer is formed by the electrolytic plating method using the compound semiconductor substrate doped in high density where the plug-shaped metal layer and the emitter electrode are exposed as one of power supply layers.

21. A method for manufacturing a semiconductor device according to one of claim 18, wherein said semiconductor substrate is a compound semiconductor substrate, and said bipolar transistor element is a heterojuntion compound semiconductor element, and said insulated isolation area is formed by increasing the resistance of the collector layer by ion implantation.

22. A method for manufacturing a semiconductor device according to one of claim 18, wherein said inter-layer dielectric layer is formed by spin-coating resin.

* * * * *